US012803501B2

(12) United States Patent
Rafi

(10) Patent No.: US 12,803,501 B2
(45) Date of Patent: Nov. 17, 2026

(54) PASSIVE UP-CONVERSION MIXER

(71) Applicant: Silicon Laboratories Inc., Austin, TX (US)

(72) Inventor: Aslamali Rafi, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 240 days.

(21) Appl. No.: 18/655,583

(22) Filed: May 6, 2024

(65) Prior Publication Data

US 2025/0343512 A1 Nov. 6, 2025

(51) Int. Cl.
*H03D 7/14* (2006.01)
*H03F 3/24* (2006.01)

(52) U.S. Cl.
CPC ......... *H03D 7/1466* (2013.01); *H03D 7/1458* (2013.01); *H03F 3/245* (2013.01); *H03F 2200/451* (2013.01)

(58) Field of Classification Search
CPC .................................................... H03D 7/1466
See application file for complete search history.

(56) References Cited

U.S. PATENT DOCUMENTS 11,239,799 B2 2/2022 Panseri et al.
2004/0192244 A1* 9/2004 Tan ...................... H03D 7/1441 455/333
2012/0256676 A1* 10/2012 Bellaouar ............ H03D 7/1458 327/108
2013/0049854 A1* 2/2013 Shafer ..................... H03F 3/195 330/2
2013/0288612 A1* 10/2013 Afsahi .................... H03F 1/223 455/73
2014/0043104 A1* 2/2014 Chen ......................... G06F 1/10 331/46
2015/0094004 A1* 4/2015 Vora ..................... H03D 7/1466 455/114.1

OTHER PUBLICATIONS

U.S. Appl. No. 18/337,278, filed Jun. 19, 2023, by Mustafa Koroglu et al., entitled Wake-Up Radio Having Stacked Circuit Configuration With Ultra-Low Powerconsumption, 38 pgs.

* cited by examiner

*Primary Examiner* — Wen W Huang
(74) *Attorney, Agent, or Firm* — Trop, Pruner & Hu, P.C.

(57) ABSTRACT

In one embodiment, an apparatus includes: a complementary metal oxide semiconductor (CMOS) up-conversion passive mixer to receive and up-convert a baseband signal to a radio frequency (RF) signal; and Class-AB amplifier circuitry coupled to the CMOS up-conversion passive mixer to receive and amplify the RF signal.

16 Claims, 9 Drawing Sheets

PASSIVE UP-CONVERSION MIXER

BACKGROUND

Wireless transmitters are used to transmit radio frequency (RF) signals of different modulation schemes, including non-constant envelope modulation schemes like orthogonal frequency division multiplexing (OFDM) (used in Wi-Fi). To handle these OFDM signals, transmitters typically include a voltage-to-current (V-to-I) converter followed by a Gilbert cell mixer, which upconverts lower frequency signals to RF signals and drives a power amplifier (PA).

At high carrier frequencies like the ones used in 5/6/7 GHz Wi-Fi bands, a Class-A Gilbert cell mixer consumes high current to drive the high output power PA. This is because the impedance presented by the input capacitance of the high output power PA is lower at higher frequencies, and therefore more current is consumed. Furthermore, the Gilbert cell mixer operates, by definition, in Class-A mode, implying that it takes high DC current to achieve a given swing at its output. By one estimate, the current consumed by a Gilbert cell mixer at these high carrier frequencies could be a significant portion of the current consumed by the PA itself (e.g., mixer consumption of 80 milliamperes (mA) and PA consumption of 185 mA), and thus adversely affects transmitter efficiency.

In addition, since a Gilbert cell mixer operates in a current mode, a linear V-to-I conversion is needed. However, typical V-to-I converters suffer from high mismatch, high noise and require a higher power supply. These concerns are raised in the context of Wi-Fi 6, 6E and 7 higher order modulation schemes like in 256 quadrature amplitude modulation (QAM) and 1024 QAM, which require a high dynamic range.

SUMMARY OF THE INVENTION

In one aspect, an apparatus includes: a complementary metal oxide semiconductor (CMOS) up-conversion passive mixer to receive and up-convert a baseband signal to a radio frequency (RF) signal; and Class-AB amplifier circuitry coupled to the CMOS up-conversion passive mixer to receive and amplify the RF signal.

In one implementation, the CMOS up-conversion passive mixer comprises a double-balanced mixer. The CMOS up-conversion passive mixer includes a plurality of switch circuits, each of the plurality of switch circuits to receive at least a portion of the baseband signal and output at least a portion of the RF signal. Each of the plurality of switch circuits may include: a first metal oxide semiconductor field effect transistor (MOSFET) of a first polarity to receive at least the portion of the baseband signal and output at least the portion of the RF signal; and a second MOSFET of a second polarity to receive at least the portion of the baseband signal and output at least the portion of the RF signal. The first MOSFET of the first polarity is to be driven by a first local oscillator (LO) signal of a pair of a plurality of complementary LO signals and the second MOSFET of the second polarity is to be driven by a second LO signal of the pair of the plurality of complementary LO signals.

In one implementation, the apparatus further comprises buffer circuitry to provide the plurality of complementary LO signals to the CMOS up-conversion passive mixer. The buffer circuitry may include a plurality of circuits, each having: an inverter to receive at least one LO signal and generate therefrom the first LO signal of the pair of the plurality of complementary LO signals, the first LO signal having a first polarity; and a buffer coupled to the inverter to generate the second LO signal of the pair of the plurality of complementary LO signals. The buffer circuitry is to provide the plurality of complementary LO signals each having a duty cycle, where a sum of the duty cycle of each of the pair of the plurality of complementary LO signals equals 100%.

In one implementation, the apparatus further comprises a bias circuit coupled to the CMOS up-conversion passive mixer, the bias circuit to generate a first bias signal and a second bias signal, where each of the plurality of switch circuits is to receive the first bias signal and the second bias signal. The bias circuit may include: a first diode-connected MOSFET to provide the first bias signal, the first diode-connected MOSFET comprising a replica of the first MOSFET of the first polarity; and a second diode-connected MOSFET to provide the second bias signal, the second diode-connected MOSFET comprising a replica of the second MOSFET of the second polarity. The bias circuit may further include: a first degeneration resistor coupled to the first diode-connected MOSFET; and a second degeneration resistor coupled to the second diode-connected MOSFET. The first bias signal is to prevent the first MOSFET of the first polarity from reverse operation. Each of the plurality of switch circuits may further have a filter capacitor coupled to a common node, the common node coupled to a first terminal of the first MOSFET of the first polarity and to a first terminal of the second MOSFET of the second polarity.

In another aspect, an integrated circuit includes: a digital-to-analog converter (DAC) to convert a digital baseband signal to an analog baseband signal; a passive up-conversion mixer coupled to the DAC to up-convert the analog baseband signal to a RF signal; a Class-AB pre-driver coupled to the passive up-conversion mixer to pre-drive the RF signal; and a Class-AB amplifier coupled to the Class-AB pre-driver to amplify the pre-driven RF signal and output an amplified RF signal.

In one implementation, the passive up-conversion mixer comprises a voltage mode up-conversion mixer to receive a first voltage signal comprising the analog baseband signal and output a second voltage signal comprising the RF signal. The passive up-conversion mixer may include a plurality of switch circuits, each of the plurality of switch circuits to receive at least a portion of the analog baseband signal and output at least a portion of the RF signal. Each of the plurality of switch circuits may include: a first MOSFET of a first polarity to receive at least the portion of the analog baseband signal and output at least the portion of the RF signal; and a second MOSFET of a second polarity to receive at least the portion of the analog baseband signal and output at least the portion of the RF signal, wherein the first MOSFET of the first polarity is to be driven by a first LO signal of a pair of complementary LO signals and the second MOSFET of the second polarity is to be driven by a second LO signal of the pair of complementary LO signals.

In one implementation, the integrated circuit further comprises: a first transformer to couple the passive up-conversion mixer to the Class-AB pre-driver; and a second transformer to couple the Class-AB pre-driver to the Class-AB amplifier.

In yet another aspect, a wireless device includes an integrated circuit, a matching circuit coupled to the integrated circuit, and an antenna coupled to the matching circuit to radiate an amplified RF signal.

In one implementation, the integrated circuit includes a DAC to convert a digital signal to an analog signal; and a CMOS passive up-conversion mixer coupled to the DAC to up-convert the analog signal to a RF signal. The CMOS passive up-conversion mixer ma include: a plurality of switch circuits, each of the plurality of switch circuits comprising CMOS devices to be driven by complementary clock signals, the CMOS devices to receive at least a portion of the analog signal and output at least a portion of the RF signal; buffer circuitry coupled to the CMOS passive up-conversion mixer to receive and use first clock signals to provide to the CMOS passive up-conversion mixer the complementary clock signals having a duty cycle; bias circuitry coupled to the CMOS passive up-conversion mixer to generate bias signals for the plurality of switch circuits, the bias signals to prevent reverse operation of the CMOS devices. The integrated circuit also may include a Class-AB pre-driver coupled to the CMOS passive up-conversion mixer to pre-drive the RF signal; and a Class-AB amplifier coupled to the Class-AB pre-driver to amplify the pre-driven RF signal and output an amplified RF signal.

In one implementation, each of the plurality of switch circuits comprises: a PMOS device to receive at least the portion of the analog signal and output at least the portion of the RF signal; and an NMOS device to receive at least the portion of the analog signal and output at least the portion of the RF signal, where the PMOS is to be driven by a first complementary clock signal and the NMOS to be driven by a second complementary clock signal. The integrated circuit also may include a transformer coupled between the CMOS passive up-conversion mixer and the Class-AB pre-driver.

DETAILED DESCRIPTION

In various embodiments, a wireless transmitter is provided with a complementary metal oxide semiconductor (CMOS) passive up-conversion mixer. In this way, reduced power consumption may be realized as compared to typical implementations in which an active mixer is present. In addition, by providing a passive mixer that operates in a voltage mode, amplification circuitry of the transmitter, including a pre-driver and a power amplifier (PA), may be implemented as Class-AB devices, providing greater power efficiency.

Figure 1:
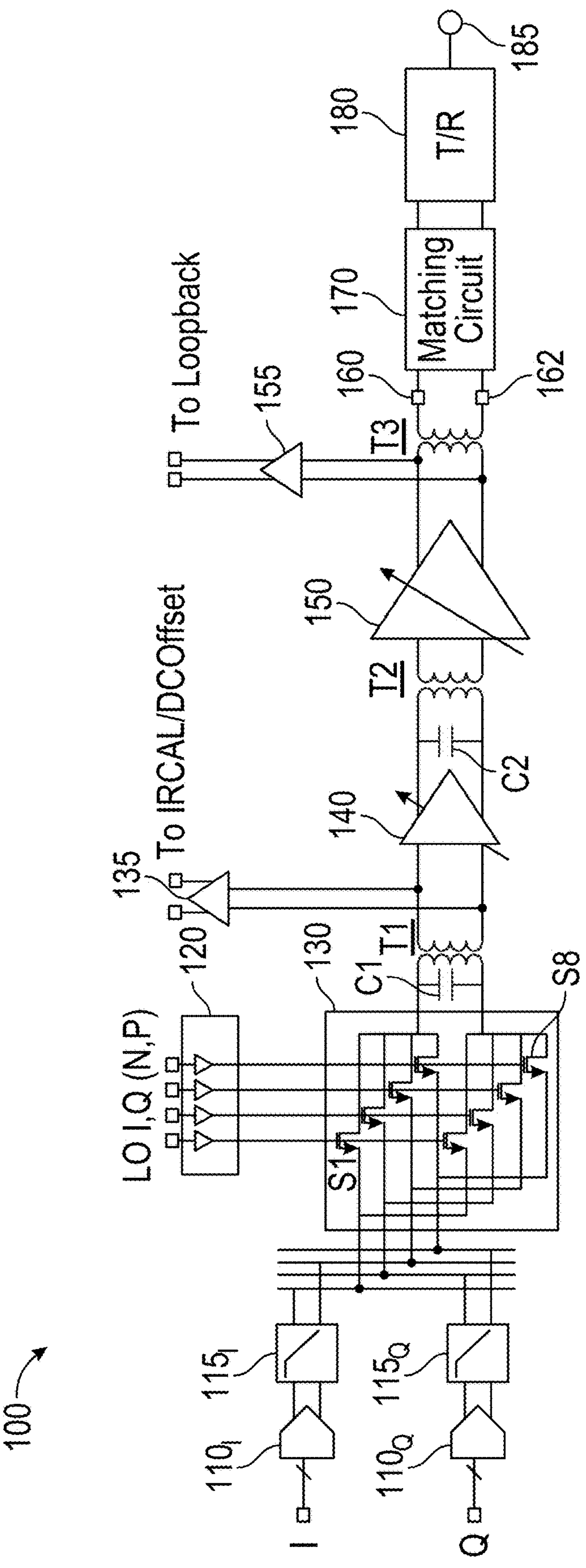
FIG. 1 is schematic diagram of a transmitter in accordance with an embodiment.

Referring now to FIG. 1, shown is a schematic diagram of a transmitter in accordance with an embodiment. As shown in FIG. 1, transmitter 100 is a wireless transmitter that may be included in any type of wireless device, such as a smartphone, tablet computer, personal computer, Internet of Things (IoT) device, or so forth. Although in typical implementations, transmitter 100 may be part of a transceiver that further includes receiver circuitry, embodiments are not so limited, and in some cases transmitter 100 may be a standalone transmitter. In the high level view of FIG. 1, understand that only certain components of a radio frequency (RF) signal processing path are shown; additional components such as additional filtering and/or gain circuitry may be present. Furthermore, while in FIG. 1 certain schematic representations are shown, understand that particular implementations may include greater amounts of circuitry, as will be described further herein.

In one or more embodiments, most of the circuitry illustrated in FIG. 1 is implemented on a single semiconductor die, which in turn may be implemented within an integrated circuit (IC). As illustrated, transmitter 100 is configured to receive incoming baseband digital signals, e.g., incoming in-phase (I) and quadrature-phase (Q) signals, that are first converted to analog signals via digitizers $\mathbf{110}_{I,Q}$, which as shown may be implemented as digital-to-analog converter (DAC) circuits, e.g., 11-bit DAC circuits. The resulting analog signals are also converted to differential form, such that there are I-channel positive (p) and negative (n) signals and Q-channel p and n signals. These signals are provided to corresponding filters $\mathbf{115}_{I,Q}$.

In an embodiment, filters 115 may be implemented as Chebyshev filters, e.g., second-order 1 dB ripple filters. In one embodiment, filters 115 may be implemented as second-order Chebyshev filters having a 1 dB cross-over frequency of approximately 54 megahertz (MHz). Note that filters 115 may be implemented with operational amplifiers (opamps). In one or more embodiments, mixer 130 may be driven directly by these opamps without needing any V/I converter. The resulting filtered analog signals output by filters 115 are provided to a CMOS passive mixer 130. Note that a passive mixer differs from an active mixer such as a Gilbert cell-type mixer, in that there is no current consumption within the mixer, which operates in a voltage mode, in contrast to the potentially significant current consumption that may be incurred in an active mixer, which operates in a current mode.

In the high level view shown in FIG. 1, CMOS mixer 130 is illustrated as including a set of switches S1-S8. In FIG. 1, each switch Sn is illustrated as a single metal oxide semiconductor field effect transistor (MOSFET), namely, an N-channel MOSFET (NMOS). However as will be described herein, in actual implementations, each such represented switch Sn may be implemented in a CMOS configuration, with both an NMOS and a P-channel MOSFET (PMOS).

As shown, the switches of CMOS mixer 130 are controlled via clock signals, namely 25% duty cycle local oscillator (LO) signals, received from a buffer 120. Buffer 120 in turn receives differential quadrature LO signals, e.g., from an on-chip LO or other clock generator. Mixer 130 operates to up-convert the analog baseband signals to a given RF frequency. The resulting RF signals couple through a first transformer T1 having a capacitor C1 coupled in parallel with the primary winding. Transformer T1 is configured to present a tuned load to mixer 130 and help achieve higher conversion gain. In turn, the secondary winding of transformer T1 couples to a pre-driver 140, implemented as a Class-AB pre-driver. As shown in the high level view of FIG. 1, pre-driver 140 may be implemented with a plurality of units or slices to provide programmable control of a desired number of slices to be enabled. Although embodiments are not limited in this regard, in one implementation pre-driver 140 may include eight slices.

Still with reference to FIG. 1, note that the RF signal input to pre-driver 140 also is provided to a buffer 135 which may in turn couple to a feedback circuit. This feedback circuit may perform image rejection calibration (IRCAL) and/or DC offset calibration. By providing a programmably controlled sliced pre-driver 140, DC offset and IRCAL algorithms may be simplified.

After amplification in pre-driver 140, the resulting RF signal is output and coupled through another transformer T2 having a capacitor C2 coupled in parallel with its primary winding. The secondary winding of transformer T2 is coupled to a PA 150, implemented as a Class-AB power amplifier. PA 150 also may be a sliced amplifier. In one implementation, PA 150 may include 127 slices that may be controlled individually and/or in groups. The resulting amplified RF signal, which may be output at a saturation power level of up to approximately 27 decibels-milliwatts (dBm), is output through another transformer T3 and from a semiconductor die via output pads 160, 162. In turn, the RF signal is provided to a matching circuit 170. In embodiments, matching circuit 170 may be a separate component, e.g., implemented on a common circuit board along with an IC including the semiconductor die. Of course in other implementations, this matching circuitry may be included within the IC.

Matching circuit 170 outputs the RF signal to a transmit/receive switch 180, which is coupled to an output node 185 that couples to an antenna (not shown for ease of illustration in FIG. 1) for transmission. Note further that the PA output also may couple through a buffer 155 to another feedback circuit, e.g., a loopback circuit. Although shown at this high level in the embodiment of FIG. 1, understand that many variations and alternatives are possible.

Figure 2:
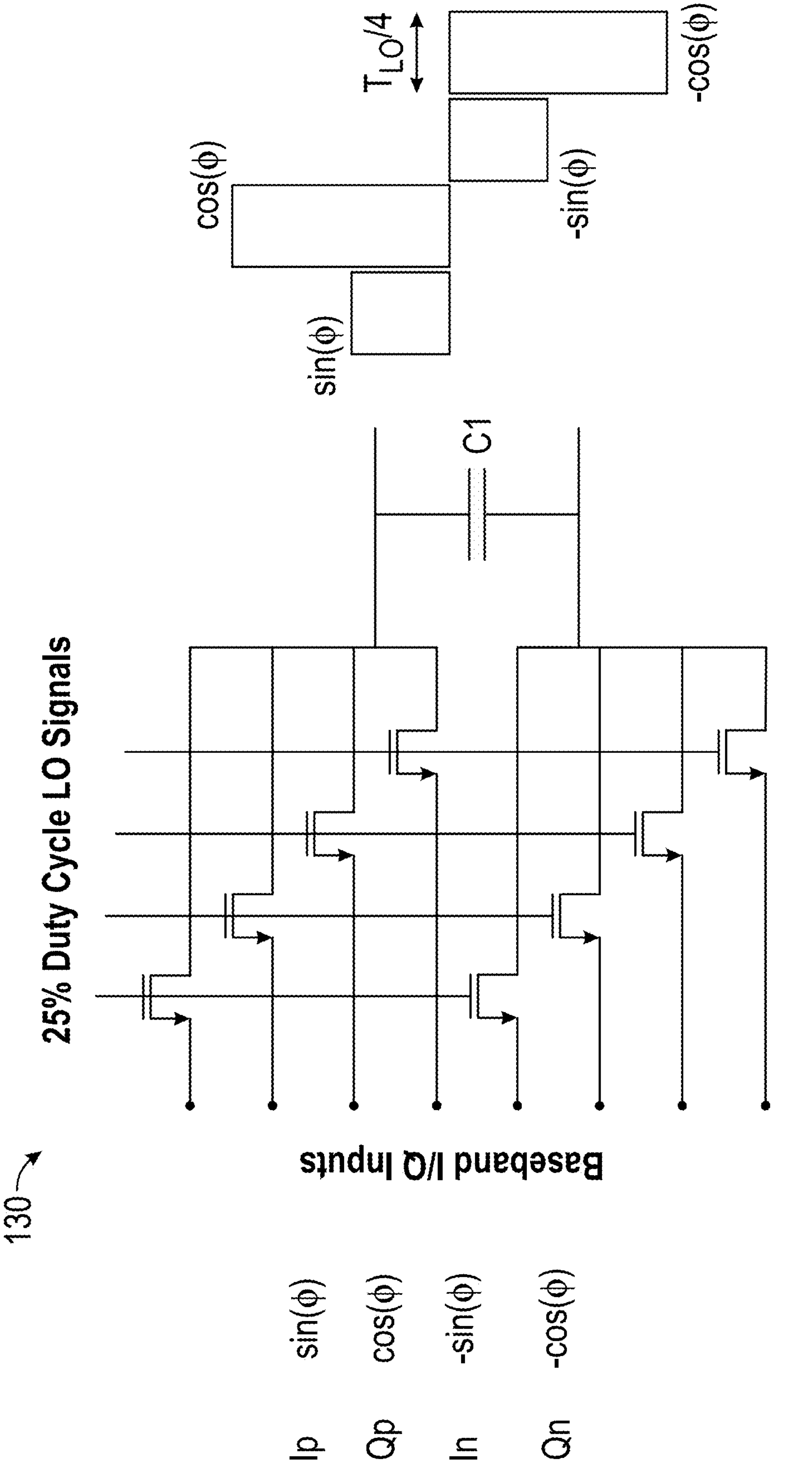
FIG. 2 is a schematic diagram of a passive mixer in accordance with an embodiment.

Referring now to FIG. 2, shown is a further illustration of a passive mixer in accordance with an embodiment. As shown in FIG. 2, passive mixer 130 is shown at the same high level as illustrated in FIG. 1. In this illustration, the incoming differential quadrature signals are shown, along with the resulting up-converted RF signal after mixing with the provided 25% duty cycle LO signals.

Figure 3A:
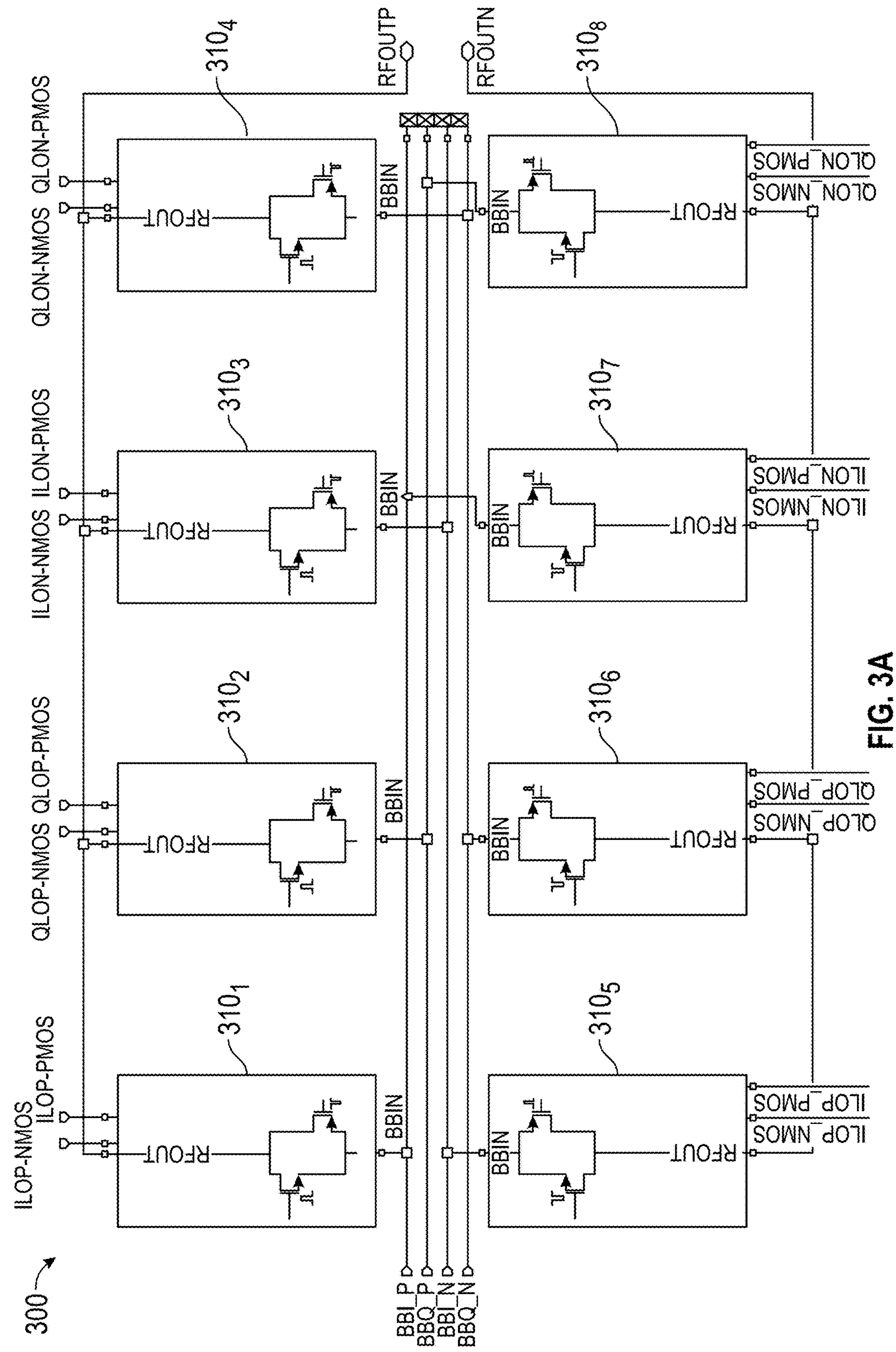
FIG. 3A is another schematic diagram of a passive mixer in accordance with an embodiment.
Figure 3B:
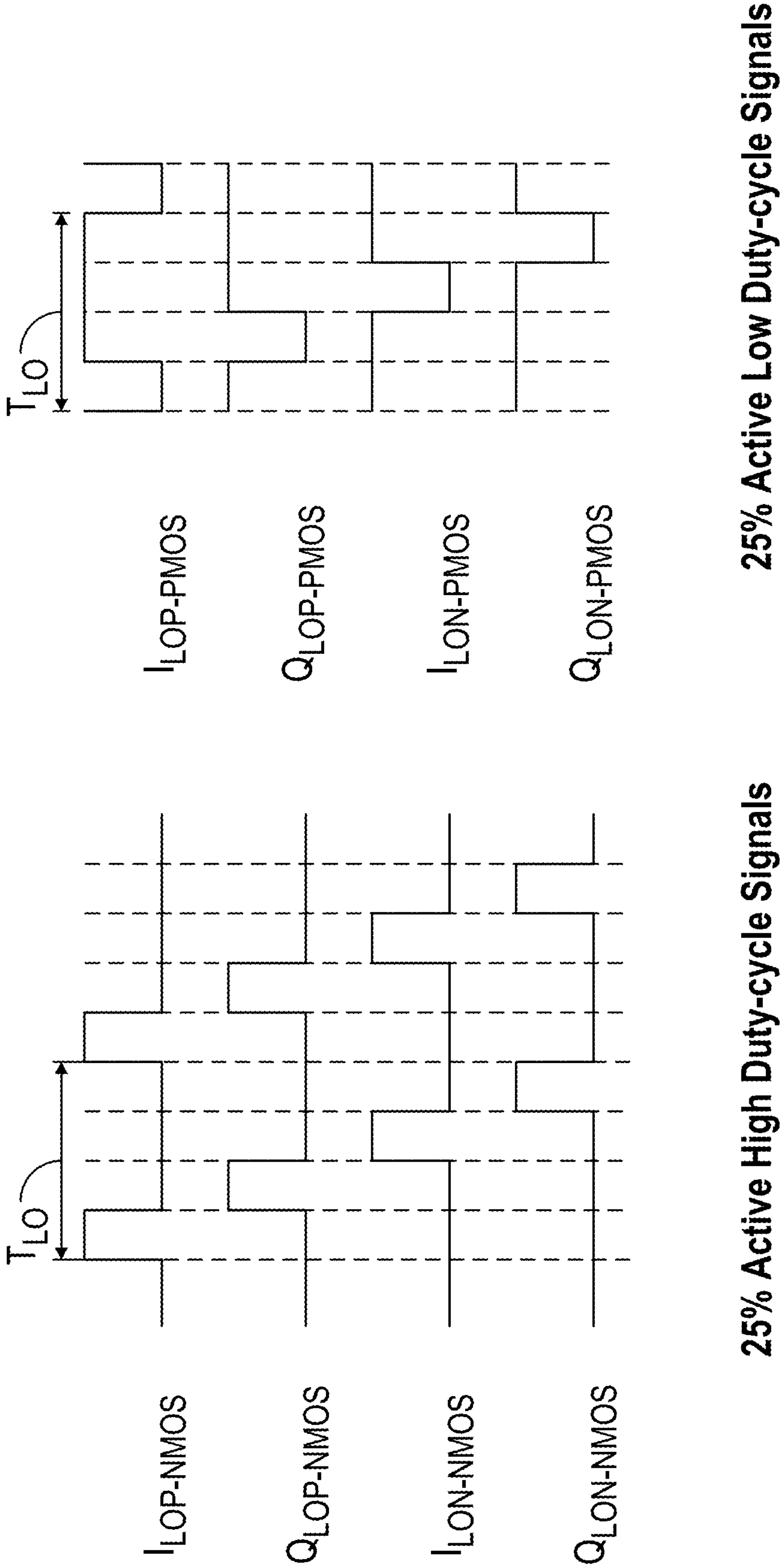
FIG. 3B is a timing diagram illustrating local oscillator duty cycle signals in accordance with an embodiment.

Referring now to FIG. 3A, shown is a schematic diagram of a CMOS passive up-conversion mixer in accordance with an embodiment. More specifically in FIG. 3A, a mixer 300 is implemented as a double-balanced CMOS passive up-conversion mixer. As shown, mixer 300 includes a plurality of CMOS mixer switches $\mathbf{310}_1$-$\mathbf{310}_8$, each of which is implemented with CMOS devices, namely, a PMOS device and an NMOS device. Each of these switches is configured to receive one of a pair of complementary LO input clock signals via its gate terminal (the polarity of these 25% LO duty cycle signals is shown near the gate terminals of the NMOS/PMOS devices internal to mixer switches 310 in FIG. 3A). That is, as shown, the NMOS devices receive a 25% active high duty cycle LO signal at their gate terminals, whereas the PMOS devices receive a 25% active-low duty cycle LO signal at their gate terminals. Note that these 25% LO duty cycle signals are shown in FIG. 3B. These LO signals are provided from a local oscillator and may couple through buffer circuitry (not shown in the illustration of FIG. 3A).

With a complementary design as in FIG. 3A, embodiments provide passive mixer circuitry that operates with high linearity, even as input signals swing over a large voltage range. That is, the NMOS and PMOS devices of the mixer switches have similar but complementary characteristics, so that even as input signals swing over a high range, the complementary devices balance out any degradation. In other words, when the input voltage at the baseband port is high, the on resistance of the NMOS switch increases whereas that of the PMOS switch decreases. The opposite happens the input voltage at the baseband port is low. This behavior leads to a total ON resistance that is lower on average as the input voltage at the baseband port moves from high to low and back. It is to be noted that if the same low average value of on resistance were to be achieved by just an NMOS switch, it would require a much larger device size. The increased capacitance of this larger device size would consume much higher current in the LO path. Also, it is to be noted for typical High-K metal gate semiconductor process technology as in the 22 nanometer (nm) process node, the PMOS device is not much slower than its NMOS counterpart as has been true for older process technologies. In the 22 nm process, the PMOS device is only about 1.25× slower than its NMOS counterpart, whereas in older process technology nodes it was 2.5-3.0× slower. This implies that by using a PMOS device there is not a significant penalty of increased gate capacitance and therefore no penalty of increased power consumption in the LO buffer. And the complementary nature of the PMOS device (to an NMOS device) provides a significant improvement in the average on resistance of the complementary LO switch. This leads to a significant improvement in the linearity of the passive mixer. In one embodiment, a CMOS passive mixer may achieve an error vector magnitude (EVM) in excess of 50 dB while processing an IEEE 802.11 ax MCS9 signal at 5.5 GHz with −7 dBm power at its output while consuming less than approximately 2 mA in the LO path.

As shown, each mixer switch 310 receives an incoming baseband input signal, namely, one of a baseband I or Q signal (and positive or negative signal, BBI_P,N and BBQ_P,N; generically, BBIN) that couples to source terminals of the NMOS and PMOS devices. In turn, the drain terminals of the NMOS and PMOS devices are coupled together and provide the corresponding RF output signal (generically RFOUT). As shown, the outputs of the resulting positive and negative sets of switches 310 couple together to provide a differential RF output signal (RFOUTP, RFOUTN). Although not shown in the high level of FIG. 3A, understand that each NMOS/PMOS device of mixer switches 310 is further configured to receive an incoming bias signal, as will be described further below.

Figure 4:
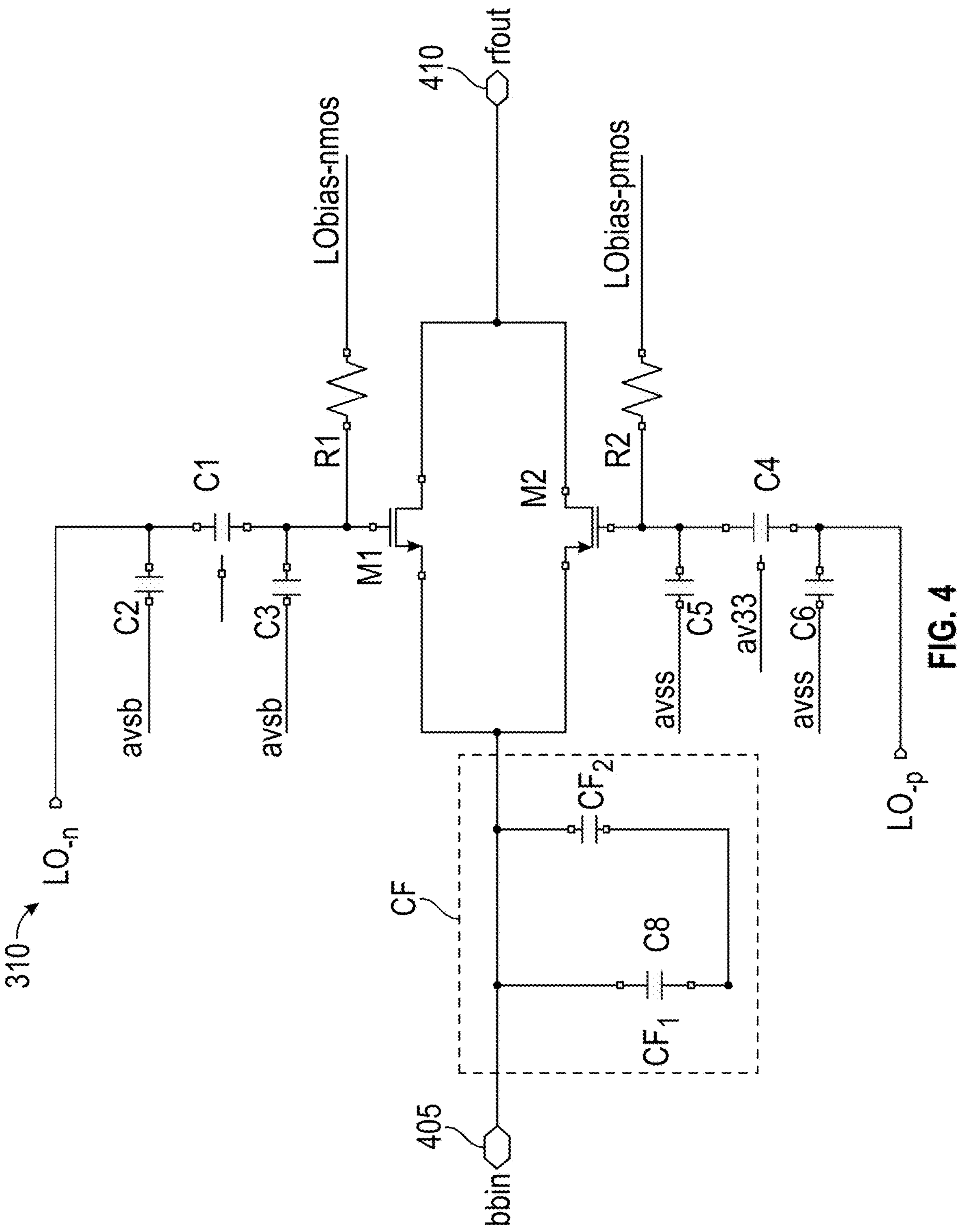
FIG. 4 is a schematic diagram of a mixer switch in accordance with an embodiment.

Referring now to FIG. 4, shown is a schematic diagram of an example CMOS mixer switch in accordance with an embodiment. In FIG. 4, a single CMOS mixer switch 310 is illustrated in detail. At a high level, CMOS mixer switch 310 includes a pair of opposite polarity MOSFETs, namely, an NMOS device M1 and a PMOS device M2. As shown, these CMOS devices have commonly coupled source terminals to receive an incoming baseband signal (bbin, via a baseband input node 405) and commonly coupled drain terminals to output a corresponding RF signal (rfout, via an RF output node 410).

As further shown, each of the CMOS devices has a gate terminal that is coupled to receive an incoming LO signal. Specifically, NMOS device M1 receives a first LO signal (LO_n) and in turn, PMOS device M2 receives a second complementary LO signal (LO_p). Note that these complementary LO signals (e.g., 1 of 4 pairs of complementary LO signals provided to a double-balanced CMOS passive mixer) are AC coupled to the gate terminals of NMOS device M1 and PMOS device M2, via DC blocking capacitors C1 and C4 (respectively).

As further shown, each gate terminal also is coupled to receive a bias voltage. Specifically NMOS device M1 has a gate terminal to receive a first bias signal (LO bias_nmos), received through a resistor R1. In turn, PMOS device M2 has a gate terminal to receive a second bias signal (LO bias_pmos), received through a resistor R2. As further shown, capacitor networks couple to the gate terminals of the CMOS devices. Specifically, first capacitor C1 is coupled in series with the gate terminal of NMOS device M1. First capacitor C1 is coupled between parallel capacitors C2, C3. In turn, capacitor C4 is coupled in series with the gate terminal of PMOS device M2. Capacitor C4 is coupled between parallel capacitors C5, C6.

As further illustrated in FIG. 4, a filtering capacitor CF couples between baseband input terminal 405 and the commonly coupled source terminals of NMOS device M1 and PMOS device M2. As illustrated in FIG. 4, capacitor CF is a capacitor network formed of parallel-coupled capacitors $CF_1$ and $CF_2$. Although shown with this particular arrangement in the embodiment of FIG. 4, understand that instead of separate capacitors, this filtering capacitor can be implemented with a single capacitor.

In embodiments, filtering capacitor CF is coupled to the baseband side of the mixer switches (M1 and M2 in FIG. 4) to reduce unwanted signal coupling. This is so, since in general, passive mixers suffer from signal coupling from an LO port (gate terminal of the mixer switches) to a baseband port (source terminals of the mixer switches) through parasitic capacitances. Filtering capacitor CF reduces the effect of this spurious coupling, by acting as a 2LO filtering capacitor. Note that the value of the capacitance is non-critical as long as it is greater than a particular value. Using a very large capacitance however, increases power dissipation in baseband circuits driving the passive mixer. In one particular implementation, CF may be implemented as a 1 picoFarad capacitance, which may sufficiently reduce the 2LO ripple on the baseband side of the mixer switches, while causing a tolerable increase in baseband current consumption. Although shown at this high level in the embodiment of FIG. 4, understand that variations and alternatives are possible.

Figure 5:
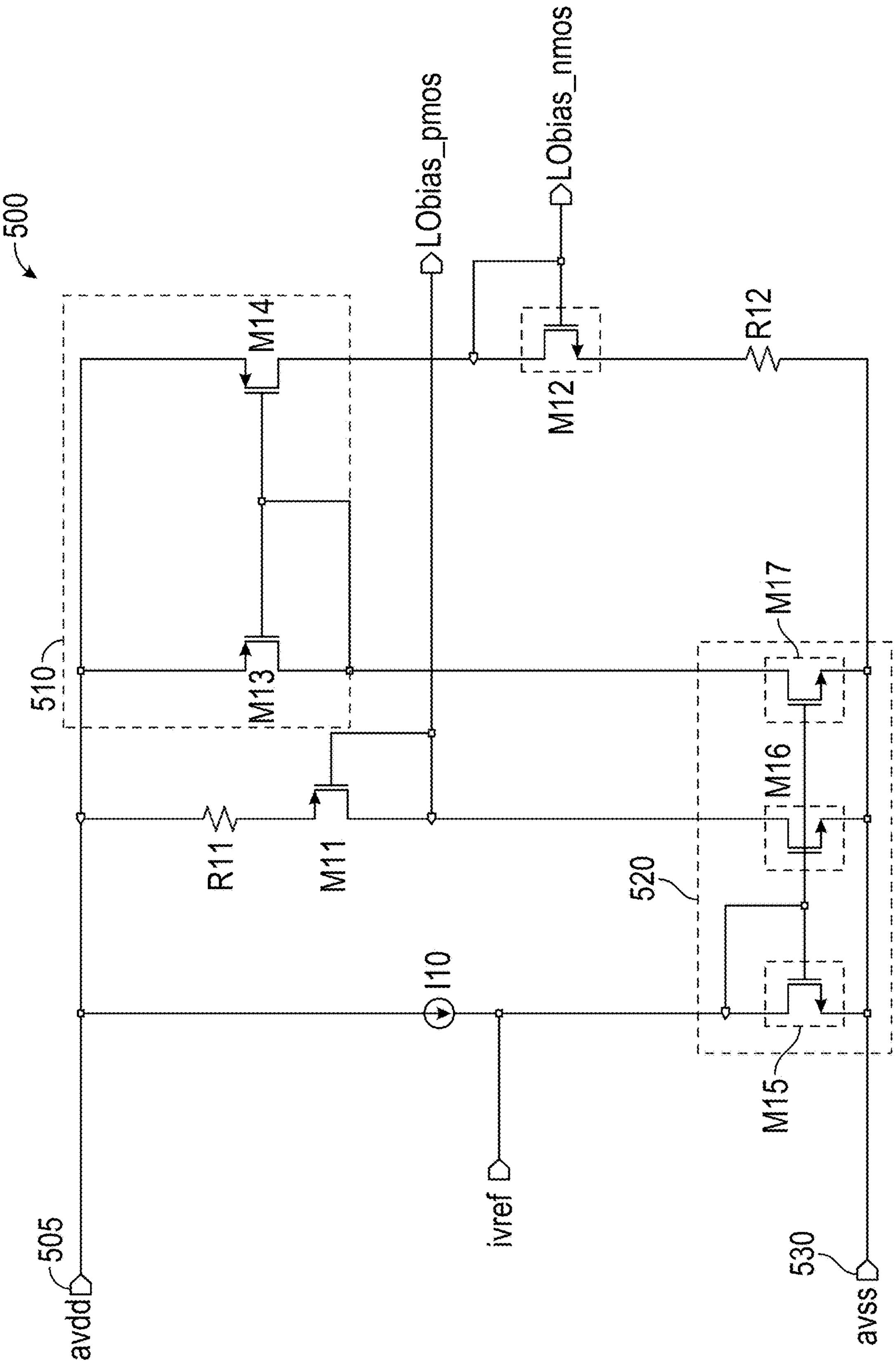
FIG. 5 is a schematic diagram of a bias circuit in accordance with an embodiment.

As discussed above, the mixer switches may be provided with bias signaling. Such bias voltages may be provided to prevent the PMOS/NMOS devices from reverse operation. In other words, these bias voltages prevent the mixer switches from turning on in the opposite direction. Referring now to FIG. 5, shown is a schematic diagram of a bias circuit in accordance with an embodiment. More specifically, as shown in FIG. 5, bias circuit 500 is configured to provide the bias voltages to the mixer switches (such as illustrated in FIG. 4 as LObias_nmos,pmos). As shown in FIG. 5, bias circuit 500 includes a diode-connected PMOS device M11 having commonly coupled gate and drain terminals to provide a first bias voltage (LObias_pmos). As shown, a source terminal of PMOS device M11 couples to a supply voltage node 505 via a resistor R11. The second bias voltage (a corresponding N-polarity LO bias signal (LObias_nmos)) is output from a diode-connected NMOS device M12 that has commonly coupled drain and source terminals to provide this bias voltage. In turn, a source terminal of NMOS device M12 couples to a reference voltage node 530 via a resistor R12.

As further illustrated in FIG. 5, the drain/gate terminals of NMOS device M12 also couple to an output device M14 of a current mirror 510 formed of MOSFETs M13-M14. Similarly, the drain/gate terminals of PMOS device M11 couple to an NMOS device M16 of a current mirror 520 formed of MOSFETs M15-M17. As shown, NMOS devices M15-M17 have commonly coupled gate terminals and source terminals coupled to reference voltage node 530. The drain (and gate) terminal of NMOS device M15 is coupled to a current source I10. The drain terminal of NMOS device M17 couples to the commonly coupled drain and gate terminals of PMOS device M13. Although shown at this high level in the embodiment of FIG. 5, many variations and alternatives are possible. Note that MOSFETs M11 and M12 of bias circuit 500 may be sized to be replicas of the MOSFETs of the CMOS switches of the CMOS mixer, and thus provide process, temperature and voltage-independent bias voltages to the CMOS switches.

Figure 6:
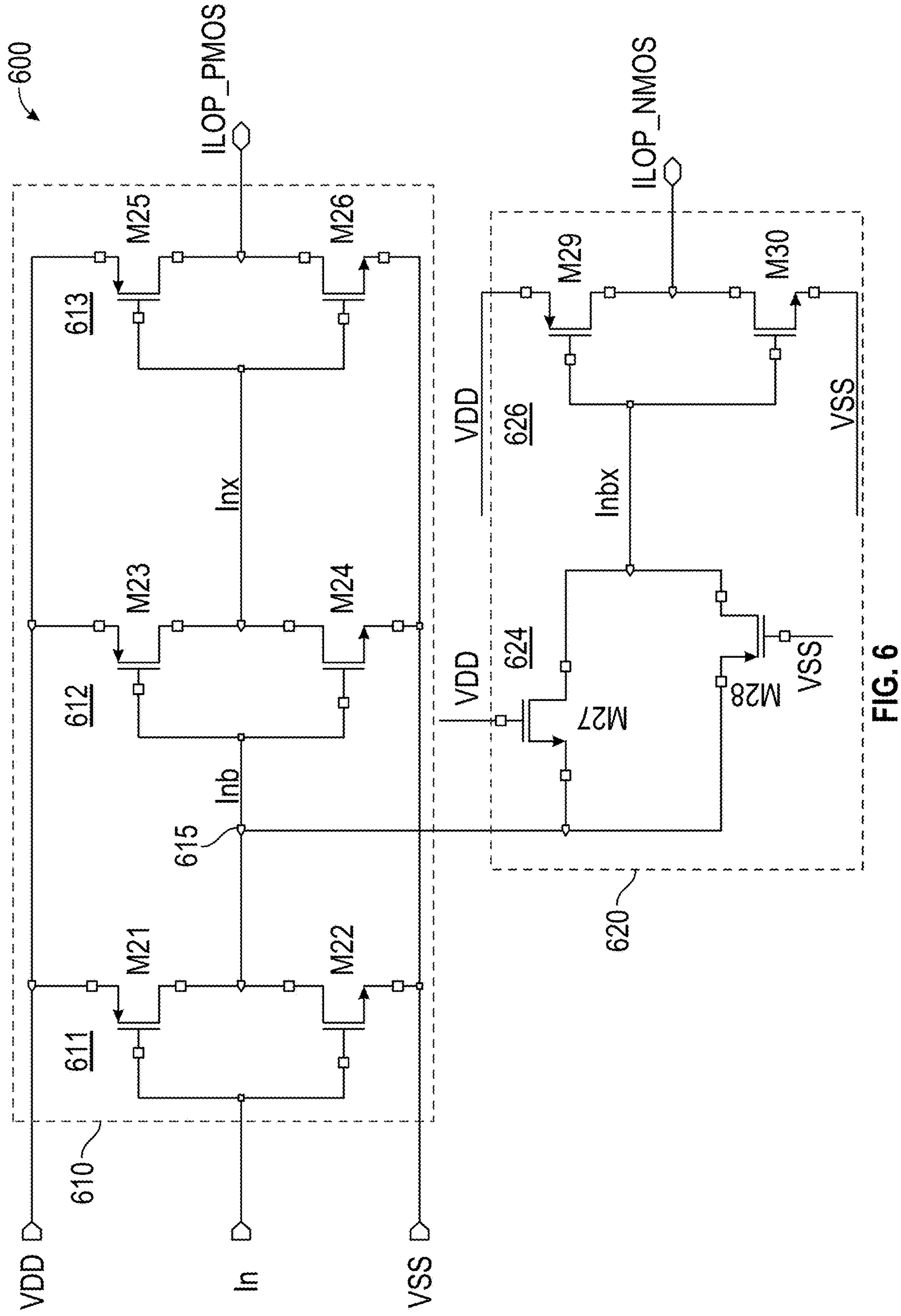
FIG. 6 is a schematic diagram of a buffer circuit in accordance with an embodiment.

In implementations, buffier circuitry is present to provide LO signals to the CMOS mixer. Referring now to FIG. 6, shown is a schematic diagram of a buffer circuit in accordance with an embodiment. More specifically as shown in FIG. 6, buffer circuit 600 is configured as a transmission gate that may be implemented to balance delays to generate the driving signals, namely the complementary 25% duty cycle LO signals for the CMOS mixer. Understand that buffer circuit 600 shown in FIG. 6 is configured to provide a pair of complementary LO signals; additional similarly configured buffer circuits are provided to generate the additional LO signals (namely, the collection of 8 individual LO signals).

As shown, buffer circuit 600 is implemented with an inverter 610 and a buffer 620. Inverter 610 includes a plurality of inverter stages 611-613, each of which includes a corresponding CMOS pair (formed of a respective PMOS device (M21, M23 and M25) and a respective NMOS device (M22, M24 and M26)). As shown, each stage 611-613 couples between a supply voltage node (VDD) and a ground node (VSS). Stage 611 includes a CMOS pair having commonly coupled gate terminals to receive an input signal (namely one of four LO signal pairs provided from a LO, shown here as ILOP_PMOS and ILOP_NMOS) and provide an output signal at commonly coupled drain terminals. This intermediate output signal in turn is provided via an intra-inverter node 615 to commonly coupled gate terminals of a CMOS pair of stage 612 (that in turn provides an intermediate output signal at commonly coupled drain terminals of the CMOS pair to commonly coupled gate terminals of a CMOS pair of stage 613). Finally, the commonly coupled drain terminals of the CMOS pair of stage 613 provide a non-inverted LO signal, ILOP_PMOS.

Still referring to buffer circuit 600, the output of stage 611 further couples at node 615 to commonly coupled source terminals of NMOS devices M27, M28 of a CMOS transmission gate 624 having commonly coupled drain terminals that provide an intermediate signal to commonly coupled gate terminals of a CMOS pair 626 that provides the inverted LO signal (ILOP_NMOS). Although shown with this particular implementation in the embodiment of FIG. 6, many variations and alternatives are possible.

Figure 7:
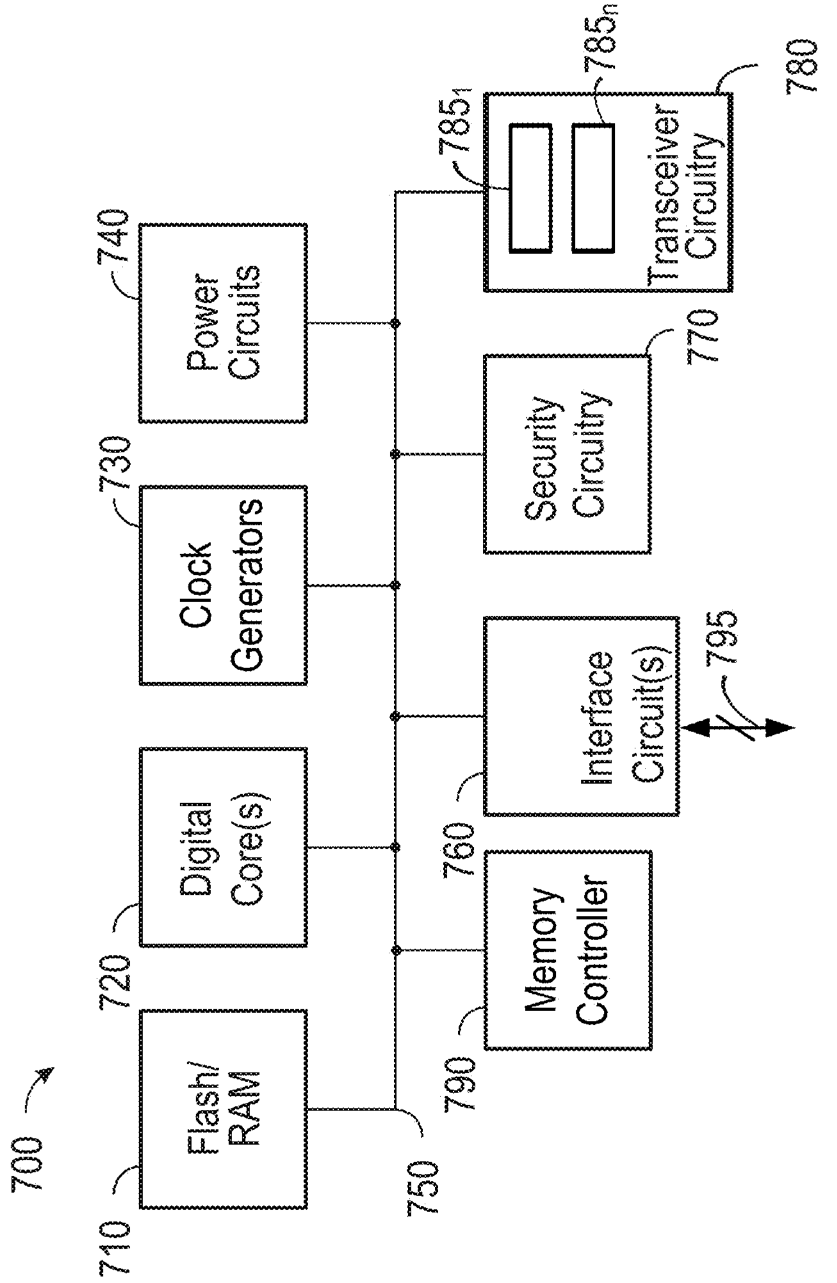
FIG. 7 is a block diagram of a representative integrated circuit that includes a passive up-conversion mixer in accordance with an embodiment.

Referring now to FIG. 7, shown is a block diagram of a representative integrated circuit 700 that includes a passive up-conversion mixer, as described herein. In the embodiment shown in FIG. 7, integrated circuit 700 may be, e.g., a dual mode wireless transceiver that may operate according to one or more wireless protocols (e.g., WLAN and Bluetooth, among others) or other device that can be used in a variety of use cases. In one or more embodiments, the circuitry of integrated circuit 700 shown in FIG. 7 may be implemented on a single semiconductor die.

Integrated circuit 700 may be included in a range of devices including a variety of stations, including smartphones, wearables, smart home devices, IoT devices, other consumer devices, or industrial, scientific, and medical (ISM) devices, among others.

In the embodiment shown, integrated circuit 700 includes a memory system 710 which in an embodiment may include volatile storage such as RAM and non-volatile memory such as flash memory. The flash memory is a non-transitory storage medium that can store instructions and data. As further shown integrated circuit 700 also may include a memory controller 790.

Memory system 710 couples via a bus 750 to one or more digital cores 720, which may include one or more cores and/or microcontrollers that act as processing units of the integrated circuit. In turn, digital cores 720 may couple to clock generators 730 which may provide one or more phase locked loops or other clock generator circuitry to generate various clocks for use by circuitry of the IC, including complementary 25% duty cycle LO clock signals provided to the passive up-conversion mixer.

As further illustrated, IC 700 further includes power circuitry 740. Additional circuitry may be present depending on particular implementation to provide various functionality and interaction with external devices. Such circuitry may include interface circuitry 760 which provides a digital communication interface with additional circuitry (such as a memory, to couple to IC 700 via a link 795). IC 700 also may include security circuitry 770 to perform wireless security techniques.

In addition, as shown in FIG. 7, transceiver circuitry 780 may be provided to enable transmission and reception of wireless signals, e.g., according to one or more of a local area or wide area wireless communication scheme, such as Zigbee, Bluetooth, IEEE 802.11, IEEE 802.15.4, cellular communication or so forth. As shown, transceiver circuitry 780 includes multiple transceiver circuits 785$_{1-n}$, to communicate according to multiple wireless communication protocols. One or more of transceiver circuits 785 include a CMOS passive up-conversion mixer as described herein, to enable up-conversion of lower frequency signals to RF signals in a low power manner, while maintaining high linearity. Understand while shown with this high level view, many variations and alternatives are possible.

Figure 8:
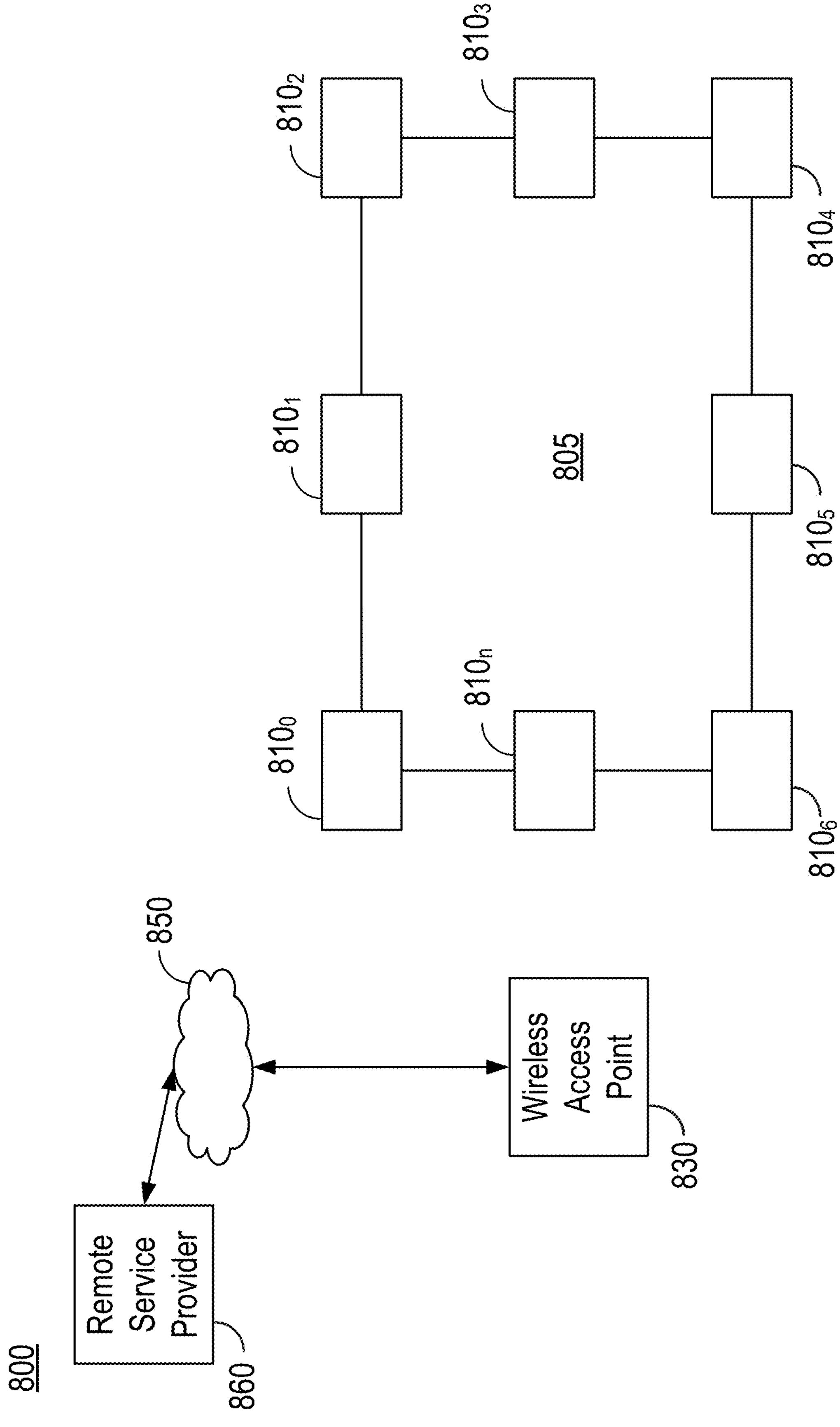
FIG. 8 is a high level diagram of a network in accordance with an embodiment.

ICs such as described herein may be implemented in a variety of different devices such as wireless stations, IoT devices or so forth. Referring now to FIG. 8, shown is a high level diagram of a network in accordance with an embodiment. As shown in FIG. 8, a network 800 includes a variety of devices, including wireless stations including smart devices such as IoT devices, access points and remote service providers, which may leverage embodiments for reducing power consumption while maintaining high linearity of a CMOS passive up-conversion mixer as described herein.

In the embodiment of FIG. 8, a wireless network 805 is present, e.g., in a building having multiple wireless devices 810$_{0-n}$. As shown, wireless devices 810 couple to an access point 830 that in turn communicates with a remote service provider 860 via a wide area network 850, e.g., the internet. Understand while shown at this high level in the embodiment of FIG. 8, many variations and alternatives are possible.

With a passive mixer in accordance with an embodiment, a high dynamic range transmitter baseband chain is realized that may achieve the better EVM performance dictated for 256 QAM and 1024 QAM. Embodiments may also achieve superior LO feedthrough performance and better spectral emission mask. In addition, embodiments may save overall power in a transmitter by enabling a Class-AB pre-driver to drive a Class-AB PA.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:

a complementary metal oxide semiconductor (CMOS) up-conversion passive mixer to receive and up-convert a baseband signal to a radio frequency (RF) signal, the CMOS up-conversion passive mixer comprising a plurality of switch circuits, each of the plurality of switch circuits to receive at least a portion of the baseband signal and output at least a portion of the RF signal and comprising:

a first metal oxide semiconductor field effect transistor (MOSFET) of a first polarity to receive at least the portion of the baseband signal and output at least the portion of the RF signal; and a second MOSFET of a second polarity to receive at least the portion of the baseband signal and output at least the portion of the RF signal, wherein the first MOSFET of the first polarity is to be driven by a first local oscillator (LO) signal of a pair of a plurality of complementary LO signals and the second MOSFET of the second polarity is to be driven by a second LO signal of the pair of the plurality of complementary LO signals; and Class-AB amplifier circuitry coupled to the CMOS up-conversion passive mixer to receive and amplify the RF signal, the RF signal having quadrature amplitude modulation.

2. The apparatus of claim 1, wherein the CMOS up-conversion passive mixer comprises a double-balanced mixer.

3. The apparatus of claim 1, further comprising buffer circuitry to provide the plurality of complementary LO signals to the CMOS up-conversion passive mixer.

4. The apparatus of claim 3, wherein the buffer circuitry comprises a plurality of circuits, each of the plurality of circuits comprising:

an inverter to receive at least one LO signal and generate therefrom the first LO signal of the pair of the plurality of complementary LO signals, the first LO signal having a first polarity; and a buffer coupled to the inverter to generate the second LO signal of the pair of the plurality of complementary LO signals.

5. The apparatus of claim 3, wherein the buffer circuitry is to provide the plurality of complementary LO signals each having a duty cycle, wherein a sum of the duty cycle of each of the pair of the plurality of complementary LO signals comprises 100%.

6. The apparatus of claim 1, further comprising a bias circuit coupled to the CMOS up-conversion passive mixer, the bias circuit to generate a first bias signal and a second bias signal, wherein each of the plurality of switch circuits is to receive the first bias signal and the second bias signal.

7. The apparatus of claim 6, wherein the bias circuit comprises:

a first diode-connected MOSFET to provide the first bias signal, the first diode-connected MOSFET comprising a replica of the first MOSFET of the first polarity; and a second diode-connected MOSFET to provide the second bias signal, the second diode-connected MOSFET comprising a replica of the second MOSFET of the second polarity.

8. The apparatus of claim 7, wherein the bias circuit further comprises:

a first degeneration resistor coupled to the first diode-connected MOSFET; and a second degeneration resistor coupled to the second diode-connected MOSFET.

9. The apparatus of claim 6, wherein the first bias signal is to prevent the first MOSFET of the first polarity from reverse operation.

10. The apparatus of claim 1, wherein each of the plurality of switch circuits further comprises a filter capacitor coupled to a common node, the common node coupled to a first terminal of the first MOSFET of the first polarity and to a first terminal of the second MOSFET of the second polarity.

11. An integrated circuit comprising:

a digital-to-analog converter (DAC) to convert a digital baseband signal to an analog baseband signal;

a passive up-conversion mixer coupled to the DAC to up-convert the analog baseband signal to a radio frequency (RF) signal, the passive up-conversion mixer comprising a plurality of switch circuits, each of the plurality of switch circuits to receive at least a portion of the analog baseband signal and output at least a portion of the RF signal and comprising:

a first metal oxide semiconductor field effect transistor (MOSFET) of a first polarity to receive at least the portion of the analog baseband signal and output at least the portion of the RF signal; and a second MOSFET of a second polarity to receive at least the portion of the analog baseband signal and output at least the portion of the RF signal, wherein the first MOSFET of the first polarity is to be driven by a first local oscillator (LO) signal of a pair of complementary LO signals and the second MOSFET of the second polarity is to be driven by a second LO signal of the pair of complementary LO signals;

a Class-AB pre-driver coupled to the passive up-conversion mixer to pre-drive the RF signal; and a Class-AB amplifier coupled to the Class-AB pre-driver to amplify the pre-driven RF signal and output an amplified RF signal.

12. The integrated circuit of claim 11, wherein the passive up-conversion mixer comprises a voltage mode up-conversion mixer to receive a first voltage signal comprising the analog baseband signal and output a second voltage signal comprising the RF signal.

13. The integrated circuit of claim 11, further comprising:

a first transformer to couple the passive up-conversion mixer to the Class-AB pre-driver; and a second transformer to couple the Class-AB pre-driver to the Class-AB amplifier.

14. A wireless device comprising:

an integrated circuit comprising:

a digital-to-analog converter (DAC) to convert a digital signal to an analog signal;

a complementary metal oxide semiconductor (CMOS) passive up-conversion mixer coupled to the DAC to up-convert the analog signal to a radio frequency (RF) signal, the CMOS passive up-conversion mixer comprising:

a plurality of switch circuits, each of the plurality of switch circuits comprising CMOS devices to be driven by complementary clock signals, the CMOS devices to receive at least a portion of the analog signal and output at least a portion of the RF signal;

buffer circuitry coupled to the CMOS passive up-conversion mixer to receive and use first clock signals to provide to the CMOS passive up-conversion mixer the complementary clock signals having a duty cycle;

bias circuitry coupled to the CMOS passive up-conversion mixer to generate bias signals for the plurality of switch circuits, the bias signals to prevent reverse operation of the CMOS devices;

a Class-AB pre-driver coupled to the CMOS passive up-conversion mixer to pre-drive the RF signal; and a Class-AB amplifier coupled to the Class-AB pre-driver to amplify the pre-driven RF signal and output an amplified RF signal;

a matching circuit coupled to the integrated circuit; and an antenna coupled to the matching circuit, the antenna to radiate the amplified RF signal.

15. The wireless device of claim 14, wherein each of the plurality of switch circuits comprises:

a P-channel metal oxide semiconductor (PMOS) device to receive at least the portion of the analog signal and output at least the portion of the RF signal; and a N-channel metal oxide semiconductor (NMOS) device to receive at least the portion of the analog signal and output at least the portion of the RF signal, wherein the PMOS device is to be driven by a first complementary clock signal and the NMOS device is to be driven by a second complementary clock signal.

16. The wireless device of claim 14, wherein the integrated circuit comprises a transformer coupled between the CMOS passive up-conversion mixer and the Class-AB pre-driver.

* * * * *